(12) United States Patent
Yu et al.

(10) Patent No.: US 10,715,122 B2
(45) Date of Patent: Jul. 14, 2020

(54) VOLTAGE-CONTROLLED DELAY GENERATOR

(71) Applicant: Qualcomm Incorporated, San Diego, CA (US)

(72) Inventors: Guolei Yu, Singapore (SG); Ajay Kumar Kosaraju, Singapore (SG); Marko Koski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/966,939

(22) Filed: Apr. 30, 2018

(65) Prior Publication Data
US 2019/0334512 A1 Oct. 31, 2019

(51) Int. Cl.
| | | |
|---|---|---|
| H03K 5/00 | (2006.01) | |
| H03K 7/08 | (2006.01) | |
| H03L 7/081 | (2006.01) | |
| H03L 7/093 | (2006.01) | |

(52) U.S. Cl.
CPC .......... *H03K 5/00* (2013.01); *H03K 5/00006* (2013.01); *H03K 7/08* (2013.01); *H03L 7/0812* (2013.01); *H03L 7/093* (2013.01); *H03K 2005/00032* (2013.01)

(58) Field of Classification Search
CPC ...................................................... H03K 7/08
See application file for complete search history.

(56) References Cited

U.S. PATENT DOCUMENTS

| | | | |
|---|---|---|---|
| 6,262,618 B1 | 7/2001 | Maggiolino | |
| 6,346,839 B1 | 2/2002 | Mnich | |
| 6,384,654 B1 | 5/2002 | Noufer | |
| 7,622,971 B2 | 11/2009 | Park et al. | |

(Continued)

FOREIGN PATENT DOCUMENTS

| | | |
|---|---|---|
| CN | 104467819 A | 3/2015 |
| DE | 2227477 A1 | 12/1973 |

OTHER PUBLICATIONS

Chen C-C., et al., "An Infinite Phase Shift Delay-Locked Loop With Voltage-Controlled Sawtooth Delay Line", IEEE Journal of Solid-State Circuits, vol. 43, No. 11, Nov. 2008, pp. 2413-2421.

(Continued)

*Primary Examiner* — Lincoln D Donovan
*Assistant Examiner* — Colleen J O Toole
(74) *Attorney, Agent, or Firm* — Colby Nipper/Qualcomm Incorporated

(57) ABSTRACT

An apparatus is disclosed that includes a voltage-controlled delay generator. In an example aspect, the apparatus includes voltage-controlled timing circuitry, duty cycle detection circuitry, and output circuitry. The voltage-controlled timing circuitry is configured to receive a control voltage. The voltage-controlled timing circuitry includes a current source, a control transistor, and a capacitor that are configured to produce a voltage indicator based on the control voltage. The duty cycle detection circuitry is coupled to the voltage-controlled timing circuitry. The duty cycle detection circuitry is configured to detect the voltage indicator and provide a duty cycle indicator based on the voltage indicator. The output circuitry is coupled to the duty cycle detection circuitry and is configured to generate a duty signal based on the duty cycle indicator.

26 Claims, 11 Drawing Sheets

(56) References Cited

U.S. PATENT DOCUMENTS 8,264,266 B2 * 9/2012 Dowlatabadi ............. G04F 5/00
327/291
2007/0262801 A1 * 11/2007 Renaud ................... H03K 7/08
327/172

OTHER PUBLICATIONS

International Search Report and Written Opinion—PCT/US2019/028523—ISA/EPO—dated Aug. 12, 2019.

* cited by examiner

VOLTAGE-CONTROLLED DELAY GENERATOR

TECHNICAL FIELD

This disclosure relates generally to electronic devices and, more specifically, to generating a delay characteristic in a duty signal based on a voltage control signal in a manner that can realize a linear transfer function.

BACKGROUND

Electronic devices include traditional computing devices such as desktop computers, notebook computers, smart phones, wearable devices like a smart watch, server computers, and the like. However, electronic devices also include other types of computing devices such as personal voice assistants, thermostats, automotive electronics, robotics, devices embedded in other machines like refrigerators and industrial tools, Internet-of-Things (IoTs) devices, and so forth. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those between and among widely distributed electronic devices using wireless or wired signals over one or more networks, such as the Internet or a cellular network. Electronic communications can also include those between different printed circuit boards, modules, chips, and cores or other circuitry of an integrated circuit within a single electronic device. Regardless, electronic communications are usually accomplished by generating or propagating signals. Typically, such electronic communications are performed more quickly or more reliably by controlling the relative timing of a signal in relation to one or more other signals.

A timing of a signal in relation to another signal is referred to as a phase difference between the two signals, or relative phases between the two signals. To use a signal to facilitate electronic communications, the phase of the signal is adjusted in many circumstances. The phase of a signal can be adjusted by, for example, delaying the signal. A delay locked loop (DLL) is a digital circuit that can delay a signal to introduce a phase shift or phase delay into the signal to produce a delayed signal. The delayed signal can be used to facilitate a timing alignment with another signal, to generate a radio frequency (RF) transmission signal, and in other usage scenarios.

In one example usage scenario, a delay locked loop can be used to shift a phase of a signal, such as a clock signal. The phase-shifted clock signal can enhance a clock rise timing with respect to a valid output timing of a data signal, with the data signal having data that is to be obtained via a sampling of the data signal responsive to the clock rise timing. The delay locked loop shifts the clock signal for the data sampling such that a rising edge of the clock signal is likely to occur near the middle of a time period during which a data value of the data signal is expected to be valid. This increases the likelihood of successfully acquiring the data signal while the data value is valid.

In another example usage scenario, a delay locked loop can shift a phase of a clock signal by some number of degrees, such as 45 degrees, to facilitate transmission of signals at radio frequencies. For instance, a harmonic rejection mixer (HRM) is employed in some radio frequency (RF) transceivers, such as by an RF transmitter thereof, to reduce the occurrence of spurious harmonic frequencies that can lower a quality of a transmission signal. An HRM typically uses at least four different phases of a clock signal (e.g., 0°, 45°, 90°, and 135°-shifted versions of the clock signal) to filter out, or at least reduce, the undesired harmonic frequencies. A delay locked loop can therefore be used to generate any of the four different phases of the clock signal for used by an HRM.

Thus, delay locked loops are employed in multiple different usage scenarios to support electronic communications with electronic devices. Consequently, electrical engineers and other designers of electronic devices strive to improve the functionality and usability of delay locked loops to facilitate electronic communications with electronic devices.

SUMMARY

An electronic device having a voltage-controlled delay generator is disclosed herein. In an example aspect, an apparatus is disclosed. The apparatus includes voltage-controlled timing circuitry, duty cycle detection circuitry, and output circuitry. The voltage-controlled timing circuitry is configured to receive a control voltage. The voltage-controlled timing circuitry includes a current source, a control transistor, and a capacitor that are configured to produce a voltage indicator based on the control voltage. The duty cycle detection circuitry is coupled to the voltage-controlled timing circuitry. The duty cycle detection circuitry is configured to detect the voltage indicator and provide a duty cycle indicator based on the voltage indicator. The output circuitry is coupled to the duty cycle detection circuitry and is configured to generate a duty signal based on the duty cycle indicator.

In an example aspect, a system is disclosed. The system includes a current source, a capacitor, and output circuitry. The current source is configured to provide a current. The capacitor is configured to accumulate a charge based on the current. The system also includes control means for producing a voltage indicator based on a control voltage and the charge accumulated at the capacitor. The system further includes detection means for providing a duty cycle indicator based on the voltage indicator. The output circuitry is configured to generate a duty signal based on the duty cycle indicator and a clock signal, with the duty signal including a delay duration having a length that is based on the control voltage.

In an example aspect, a method for operating a voltage-controlled delay generator is disclosed. The method includes routing a current through a transistor to a capacitor to accumulate a charge at the capacitor and increasing a charging voltage based on the routing and the charge at the capacitor. The method also includes tracking a difference between a control voltage and the charging voltage using the transistor. The method additionally includes monitoring a voltage indicator that changes based on the difference between the control voltage and the charging voltage. Responsive to the monitoring of the voltage indicator, the method further includes triggering a duty cycle indicator. The method also includes terminating a delay duration of a period of a duty signal responsive to the triggering of the duty cycle indicator.

In an example aspect, an apparatus is disclosed. The apparatus includes a current source, a control transistor, a capacitor, a trigger transistor, and output circuitry. The current source is configured to provide a current. The control transistor is coupled to the current source. The control transistor is configured to receive a control voltage and to receive the current from the current source and selectively pass or block the current. The control transistor is also configured to produce a voltage indicator based on the control voltage and a charging voltage. The capacitor is coupled to the control transistor and is configured to accumulate a charge responsive to the control transistor passing the current from the current source. The charging voltage is configured to change responsive to an accumulation of the charge. The trigger transistor is coupled to the control transistor and is configured to receive the voltage indicator and activate a duty cycle indicator based on the voltage indicator. The output circuitry is coupled to the trigger transistor. The output circuitry is configured to generate a duty signal based on the duty cycle indicator and a clock signal, with the duty signal including a delay duration having a length that is based on the control voltage.

DETAILED DESCRIPTION

Figure 1:
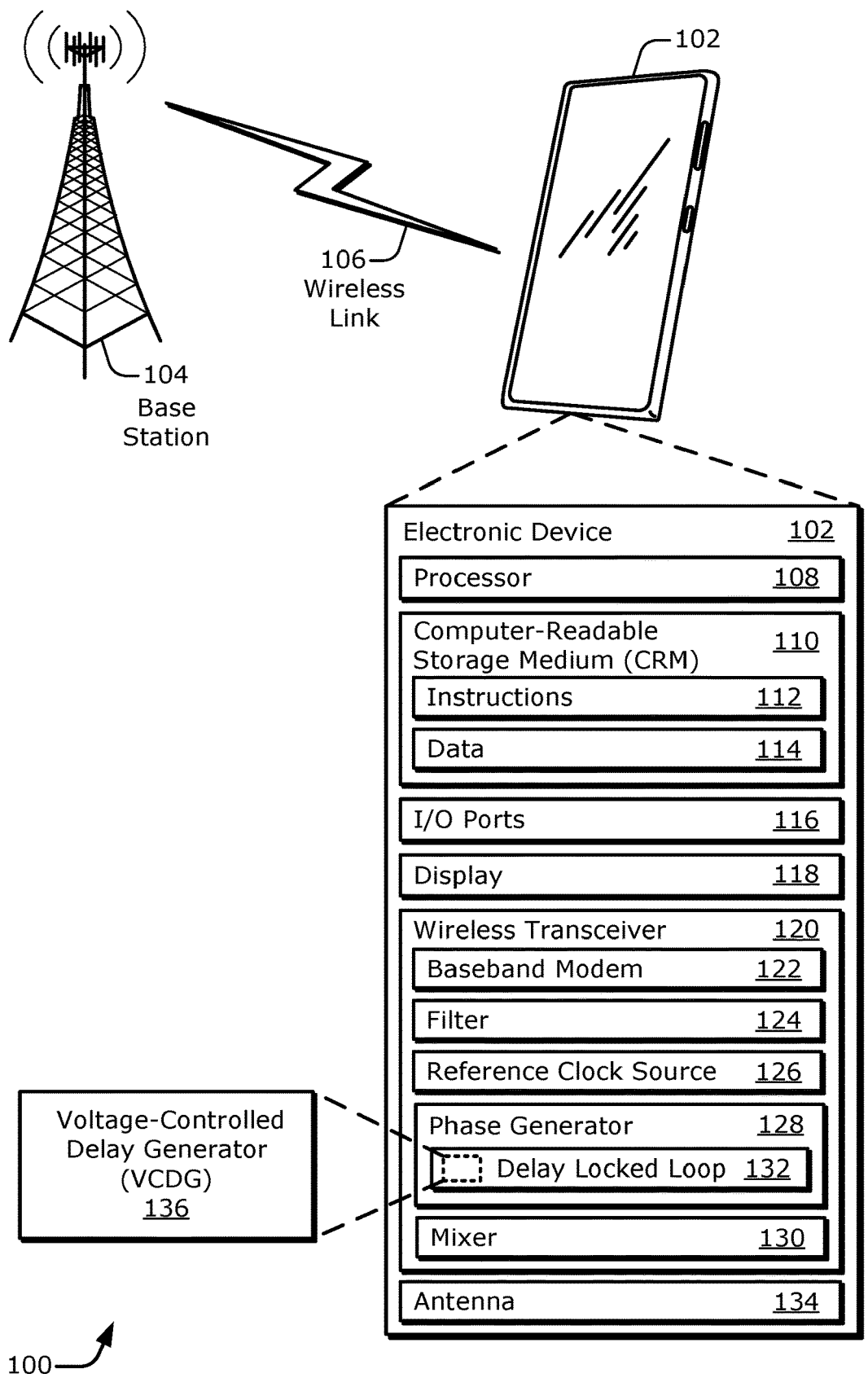
FIG. 1 illustrates an example environment that includes a wireless transceiver having a delay locked loop in which a voltage-controlled delay generator (VCDG) can be implemented.

A delay locked loop (DLL) is a digital circuit that can introduce a phase delay into a signal, such as a clock signal or another signal whose use may be dependent on a timing aspect. A delay locked loop can be deployed, for example, to improve a timing used to latch a data value from a data signal or to facilitate radio frequency (RF) signal transmission in conjunction with a harmonic rejection mixer (HRM).

A delay locked loop can also be deployed in power-related circuitry. For example, a power management integrated circuit (PMIC) can include a delay locked loop. A buck or other switch-based voltage regulator, for instance, can employ a delay locked loop to facilitate an accurate timing of the switching functionality to provide a precisely-controlled output voltage.

A typical delay locked loop includes a reference clock source, a phase comparator, and a delay unit. In some scenarios, the delay unit is implemented as a voltage-controlled delay line (VCDL). An existing linear voltage-controlled delay line includes a comparator in which a changing voltage is compared to a control voltage to establish a delay amount. The comparator, however, is relatively slow to produce an output indicative of a result of the comparison (e.g., an indication of which voltage is higher). This slow operation and resulting long comparison time creates a comparator latency that enforces a lower limit on how short the delay amount of the voltage-controlled delay line can be. Further, if the comparator is designed or driven so as to generate a comparison result more quickly, the comparator draws a greater current. This greater current consumes more power, which can be expensive and drains batteries faster. An existing non-linear voltage-controlled delay line avoids using a comparator. However, the associated non-linear transfer function means that an output delay amount does not change linearly with changes to an input control voltage. Unfortunately, compensating for this non-linearity is difficult. Consequently, using the non-linear voltage-controlled delay line with other circuitry in a predictable manner is problematic.

In contrast with existing approaches, a voltage-controlled delay generator is described herein that provides a linear input-output response without using a comparator. In described implementations of the voltage-controlled delay generator, an explicit comparison with a comparator is omitted to increase the speed of operation while also avoiding a substantial increase in current. Instead of an explicit comparison, an implicit comparison between two voltages can be made using a threshold voltage of a field effect transistor (FET). A first voltage of the two voltages is provided by a control voltage. A size or level of the control voltage controls a delay duration or pulse width of a cycle of a clock signal. A second voltage of the two voltages is established via a capacitor. The capacitor establishes the second voltage by accumulating a charge that is delivered by a current from a current source, such as a constant or other determinable current from a given current source. Due to the known current being applied to the capacitor, the second voltage increases at a determinable rate, and the voltage-controlled delay generator can be configured to operate with a linear transfer function.

In some implementations, a voltage-controlled delay generator outputs a duty signal having a delay duration with a length that depends on a size of a control voltage. The voltage-controlled delay generator includes a stack of components that are coupled together in series between a supply voltage and an equipotential, such as ground. The stack of components includes a current source (e.g., a constant current source in this example), a control transistor, and a capacitor. The constant current source provides a constant current that can be routed to the capacitor to accumulate charge and build a charging voltage. The constant current is routed through the control transistor to the capacitor. The control transistor can selectively pass the constant current to, or block the constant current from reaching, the capacitor.

At a beginning of a period of a clock signal, the charge at the capacitor is drained and the charging voltage starts at a zero or a negligible voltage level responsive to an edge of a clock signal. At this time, the control transistor permits the constant current to flow to the capacitor. Gradually, the charging voltage rises at the capacitor. During the rise of the charging voltage, the control transistor tracks the charging voltage and implicitly compares the charging voltage to a control voltage, which can be applied to a gate terminal of the control transistor. A difference between the control voltage and the charging voltage determines when the control transistor starts to block the constant current. Once the difference becomes smaller than a given threshold voltage differential, the control transistor turns off and starts to block the constant current.

Thus, a size of the control voltage determines how large the charging voltage is permitted to reach and thus how long the constant current is permitted to flow to the capacitor. This length of time at least partially sets the delay duration for the duty signal that the voltage-controlled delay generator outputs. In some implementations, a difference between a control voltage at a gate terminal and a charging voltage at a source terminal of an N-type metal-oxide-semiconductor (NMOS) FET can be used to track the relative voltage levels and at least partially establish a length of the delay duration generated by the voltage-controlled delay generator. After the control transistor blocks the flow of the constant current to the capacitor, a voltage detector detects a change to a voltage indicator associated with the control transistor. The voltage detector then triggers a termination of the delay duration portion of a period of the clock signal using output circuitry, which can include one or more inverters.

In these manners, a voltage-controlled delay generator can be implemented that omits a comparator while still realizing a linear transfer function. A speed of operation of the voltage-controlled delay generator can therefore be increased without increasing a current drawn by a comparator. Generally, examples of a voltage-controlled delay generator include a delay unit and a voltage-controlled delay line (VCDL). In addition to use with a delay locked loop, a voltage-controlled delay generator as described herein can be used with a duty locked loop, a switch-based voltage regulator, and so forth.

FIG. 1 illustrates an example environment 100 that includes a wireless transceiver 120 having a delay locked loop 132 in which a voltage-controlled delay generator 136 (VCDG 136) can be implemented. The example environment 100 includes an electronic device 102 that communicates with a base station 104 through a wireless communication link 106 (wireless link 106). In this example, the electronic device 102 is implemented as a smart phone. However, the electronic device 102 may be implemented as any suitable computing or electronic device, such as a modem, cellular base station, broadband router, access point, cellular phone, gaming device, navigation device, media device, laptop computer, desktop computer, tablet computer, server computer, network-attached storage (NAS) device, smart appliance, vehicle-based communication system, Internet-of-Things (IoTs) device, wearable device such as a smart watch or augmented reality (AR) glasses, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, fiber optic line, another electronic device generally, and so forth. Hence, the electronic device 102 may communicate with the base station 104 or another device via a wired connection, a wireless connection, or a combination thereof.

The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or multi-core processor, that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes a wireless transceiver 120 and an antenna 134. The wireless transceiver 120 provides connectivity to respective networks and other electronic devices connected therewith. Alternatively or additionally, the electronic device 102 may include a wired transceiver, such as an Ethernet or fiber optic interface for communicating over a personal or local network, an intranet, or the Internet. The wireless transceiver 120 may facilitate communication over any suitable type of wireless network, such as a wireless local area network (LAN) (WLAN), a peer-to-peer (P2P) network, a mesh network, a cellular network, a wireless wide-area-network (WWAN), and/or a wireless personal-area-network (WPAN). In the context of the example environment 100, the wireless transceiver 120 enables the electronic device 102 to communicate with the base station 104 and networks connected therewith.

The wireless transceiver 120 includes circuitry and logic for transmitting or receiving a communication signal for at least one communication frequency band. In operation, the wireless transceiver 120 can implement at least one, e.g., radio frequency (RF) transceiver to process data and/or signals associated with communicating data of the electronic device 102 via the antenna 134. The wireless transceiver 120 includes at least one baseband modem 122 or other communications-oriented processor. The baseband modem 122 may be implemented as a system on-chip (SoC) that provides a digital communication interface for data, voice, messaging, and other applications of the electronic device 102. The baseband modem 122 may also include baseband circuitry to perform high-rate sampling processes that can include analog-to-digital conversion (ADC), digital-to-analog conversion (DAC), gain correction, skew correction, frequency translation, and so forth. The baseband modem 122 may alternatively be separate from the wireless transceiver 120.

Generally, the wireless transceiver 120 can include bandpass filters, switches, amplifiers, and so forth for routing and conditioning signals that are transmitted or received via the antenna 134. As shown, the wireless transceiver 120 also includes at least one filter 124, at least one reference clock source 126, at least one phase generator 128, and at least one mixer 130. Here, the phase generator 128 includes at least one delay locked loop 132 (DLL 132). Thus, the wireless transceiver 120 can provide some attenuation for wireless signals at different frequencies using the filter 124 (e.g., a lowpass or bandpass filter). The wireless transceiver 120 can further perform frequency conversion using the mixer 130, which may include an upconverter and/or a downconverter that performs frequency conversion in a single conversion step, or through multiple conversion steps. The wireless transceiver 120 may also include logic to perform in-phase/quadrature (I/Q) operations, such as synthesis, encoding, modulation, decoding, demodulation, and so forth.

In some cases, components of the wireless transceiver 120 are implemented as separate receiver and transmitter entities. Additionally or alternatively, the wireless transceiver 120 can be realized using multiple or different sections to implement respective receiving and transmitting operations (e.g., using separate transmit and receive chains). In operation, to transmit and receive wireless communications such as the wireless link 106, the wireless transceiver 120 generates various signals having different amplitudes, frequencies, phases, and so forth. For example, the reference clock source 126 produces a reference clock signal. The phase generator 128 is coupled to the reference clock source 126 to receive the reference clock signal. The phase generator 128 can generate one or more signals having different phases based on the reference clock signal. To do so, the delay locked loop 132 can delay the reference clock signal to produce at least one delayed signal to adjust the phase thereof.

An example delay locked loop 132, which includes a voltage-controlled delay generator 136, is described below with reference to FIG. 2. The voltage-controlled delay generator 136 can at least partially implement systems and techniques that are described herein. Examples of signals and other performance parameters for a voltage-controlled delay generator 136 are described below with reference to FIG. 3. A schematic diagram of an example voltage-controlled delay generator 136 is then described with reference to FIG. 4. Example components and implementations for realizing a voltage-controlled delay generator 136 are described thereafter with reference to FIGS. 5-8.

Figure 2:
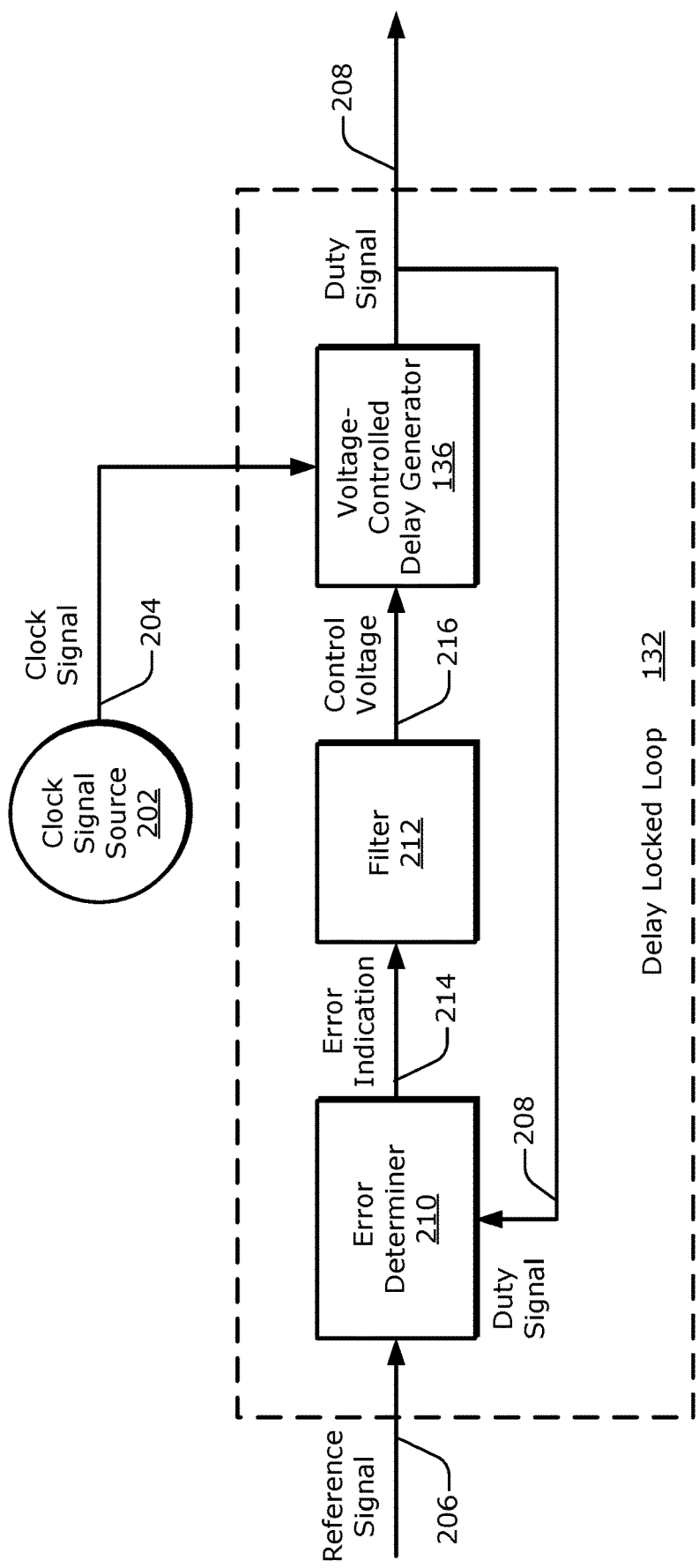
FIG. 2 illustrates an example delay locked loop that includes a voltage-controlled delay generator.

FIG. 2 illustrates, at 200, an example delay locked loop 132 that includes a voltage-controlled delay generator 136 (VCDG 136). A clock signal source 202 is coupled to the delay locked loop 132. The clock signal source 202 provides a clock signal 204 to the delay locked loop 132. The delay locked loop 132 also receives a reference signal 206, such as from the reference clock source 126 of FIG. 1. As shown, the delay locked loop 132 includes an error determiner 210, a filter 212, and the voltage-controlled delay generator 136. In example implementations, the delay locked loop 132 outputs a duty signal 208 based on the reference signal 206 and the clock signal 204.

The clock signal 204 can oscillate at one or more frequencies to provide an oscillating clock signal or an oscillation signal. The clock signal source 202 can include an oscillator (not shown) that generates a clock signal 204, can strengthen or condition a clock signal 204 received from another component, can change a frequency of a received clock signal 204, can selectively gate or release an incoming clock signal 204, can represent a portion of a clock tree, some combination thereof, and so forth. The clock signal source 202 is coupled to the delay locked loop 132 and provides the clock signal 204 to the voltage-controlled delay generator 136 thereof.

In example implementations, the error determiner 210, the filter 212, and the voltage-controlled delay generator 136 form a feedback loop. Starting from the left of the feedback loop, the error determiner 210 receives the reference signal 206 and the duty signal 208, which is fed back from an output of the delay locked loop 132 as generated by the voltage-controlled delay generator 136. The error determiner 210 compares the reference signal 206 and the duty signal 208 to determine an error indication 214, such as an indication of an extent to which the duty signal 208 deviates from the reference signal 206. The error determiner 210 can be implemented using, for example, a phase comparator.

The error determiner 210 provides the error indication to the filter 212. The filter 212 receives the error indication 214, processes the indication, and outputs a control voltage 216. The filter 212 can, for instance, apply a gain to the error indication 214 to prepare the control voltage 216 such that the control voltage 216 adjusts the duty signal 208 to bring the delay locked loop 132 into a locked state. The filter 212 can be implemented using, for example, an amplifier. The control voltage 216 is forwarded to the voltage-controlled delay generator 136.

Thus, the voltage-controlled delay generator 136 receives as input the control voltage 216 and the clock signal 204. Based on the control voltage 216 and the clock signal 204, the voltage-controlled delay generator 136 outputs the duty signal 208. Example implementations for generating the duty signal 208 are described below at FIG. 4 et seq. Example conditions and relative characteristics for the clock signal 204, the duty signal 208, and the control voltage 216 are described below with reference to FIG. 3.

In some implementations of a delay locked loop 132, a single clock source can provide a single signal as the reference signal 206 and the clock signal 204. Although the voltage-controlled delay generator 136 is shown in the context of a delay locked loop 132, a voltage-controlled delay generator 136 as described herein can be implemented in alternative environments and scenarios. Example alternative environments include a duty locked loop, a switch-based voltage regulator such as a buck regulator, and so forth. In a voltage regulator scenario, for instance, the reference signal 206 can be derived from a switching signal of the regulator.

Figure 3:
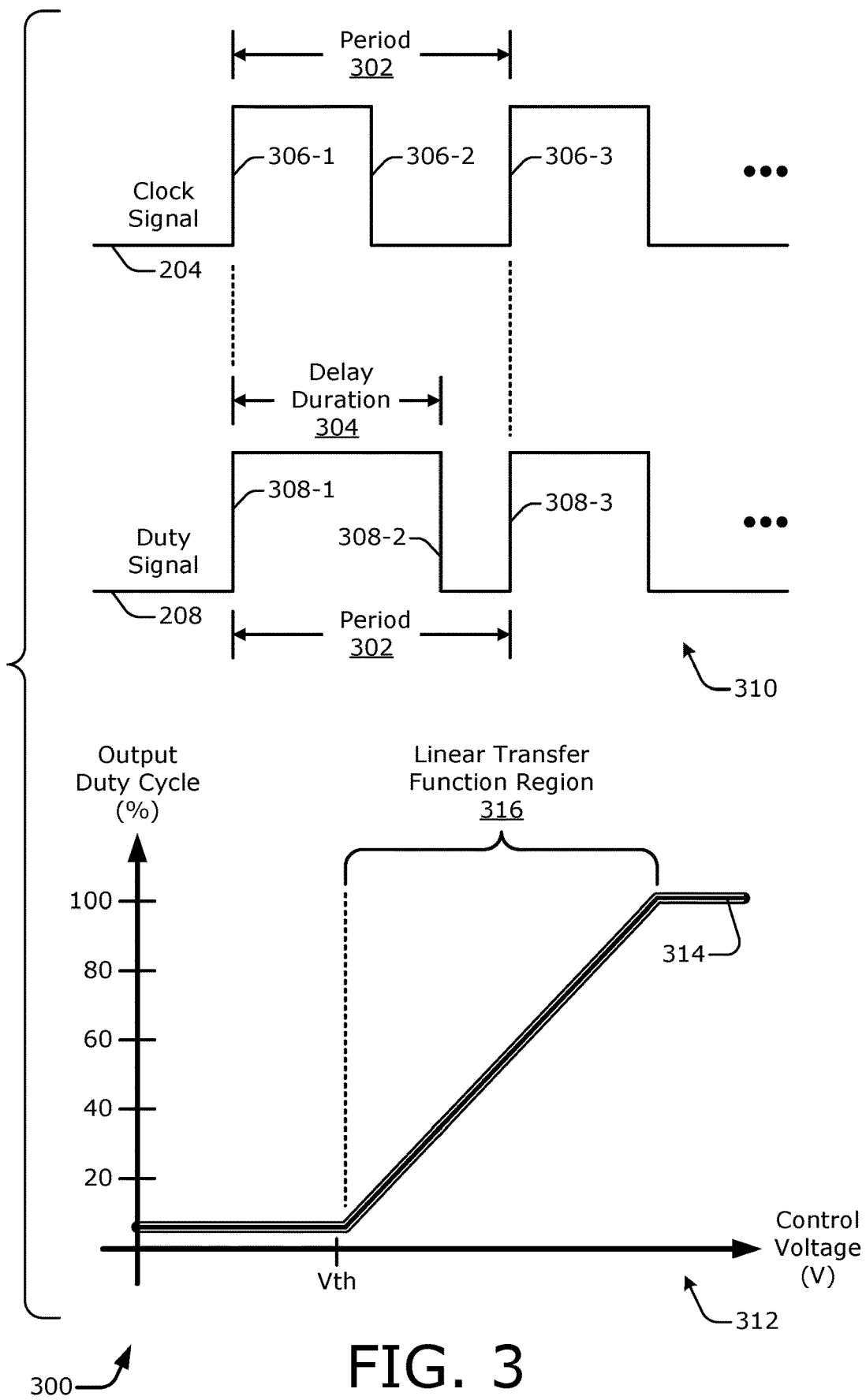
FIG. 3 depicts multiple graphs that illustrate example signal timing diagrams and an example linear transfer function for a voltage-controlled delay generator.

FIG. 3 depicts, at 300, multiple graphs that illustrate example signal timing diagrams and an example linear transfer function for a voltage-controlled delay generator as described herein. The graph 310 depicts the signal timing diagrams, and the graph 312 depicts the linear transfer function. The graph 310 includes a clock signal 204 and a duty signal 208. The clock signal 204 includes a period 302 for each cycle of the clock signal 204. The clock signal 204 includes a series of edges, three of which are explicitly indicated, including an edge 306-1, an edge 306-2, and an edge 306-3. These edges include adjacent edges, like the edge 306-1 and the edge 306-2. These edges also include consecutive edges of a same edge type, such as the edge 306-1 and the edge 306-3. Two consecutive edges of a same edge type define the period 302 of the clock signal 204, which are two rising edges 306-1 and 306-3 in the illustrated example.

An example of a corresponding duty signal 208 is depicted below the clock signal 204. The duty signal 208 includes multiple edges, three of which are explicitly indicated, including an edge 308-1, an edge 308-2, and an edge 308-3. These edges include adjacent edges, like the edge 308-1 and the edge 308-2. These edges also include consecutive edges of a same edge type, such as the edge 308-1 and the edge 308-3. In some implementations, such as the one shown by the graph 310, the duty signal 208 can have a same period 302 as that defined by the edges of the clock signal 204. Thus, the edge 308-1 and the edge 308-3 of the duty signal 208 correspond respectively to the edge 306-1 and the edge 306-3 of the clock signal 204. This can occur, for example, if the beginning and ending of the period 302 of the duty signal 208 is caused by the edge 306-1 and the edge 306-3 of the clock signal 204, as is described below.

Although the beginning and ending edges of the period 302 coincide for the clock signal 204 and the duty signal 208, the intervening edges need not do so. In other words, the "interior" edge 308-2 of the duty signal 208 does not usually coincide with the "interior" edge 306-2 of the clock signal 204 (unless the duty cycle is set to 50%). Instead, a length of time between the edge 308-1 and the edge 308-2 represents a delay duration 304. This pulse width of the delay duration 304 is adjustable based on the control voltage 216 (e.g., of FIG. 2). For example, as the control voltage 216 is increased, a length of the delay duration 304 is increased. Conversely, as the control voltage 216 is decreased, a length of the delay duration 304 is decreased.

Thus, a voltage-controlled delay generator can generate a delay duration 304 having a length that is adjustable under the control of a voltage. A duty cycle of the duty signal 208 is a function of a length of the delay duration 304 (e.g., the pulse width of the duty signal 208) and a length of the period 302 of a cycle of the duty signal 208. For instance, a duty cycle of the duty signal 208, expressed as a percentage, can be calculated by dividing the delay duration 304 by the period 302.

The graph 312 depicts an example of the output duty cycle (in percentage (%)) versus a control voltage (V), such as the control voltage 216 of FIG. 2. The graph 312 includes a transfer function 314 in terms of control voltage and output duty cycle. The control voltage axis includes an indication for a threshold voltage (Vth)—e.g., a threshold voltage of a transistor, such as a field effect transistor (FET). A control transistor that is associated with a relevant threshold voltage is described below with reference to FIG. 5. While the control voltage is below the threshold voltage, the output duty cycle is flat and below 10%, as depicted by a left region of the transfer function 314. While the control voltage is well above the threshold voltage, the output duty cycle is flat and pegged at approximately 100%, as depicted by a right region of the transfer function 314. However, between these two flat regions, the transfer function 314 includes a linear transfer function region 316. In the linear transfer function region 316, a first change to the control voltage results in a second change to the output duty cycle. Regardless of the absolute or relative magnitude of the first change, the first change and the second change have a linear relationship as long as the control voltage remains within the linear transfer function region 316. The linear nature of the relationship between a control voltage change and a resulting change to the delay duration 304 enables the voltage-controlled delay generator 136 to be more easily incorporated into a circuit, without having to make accommodations to compensate for nonlinear behavior.

Figure 4:
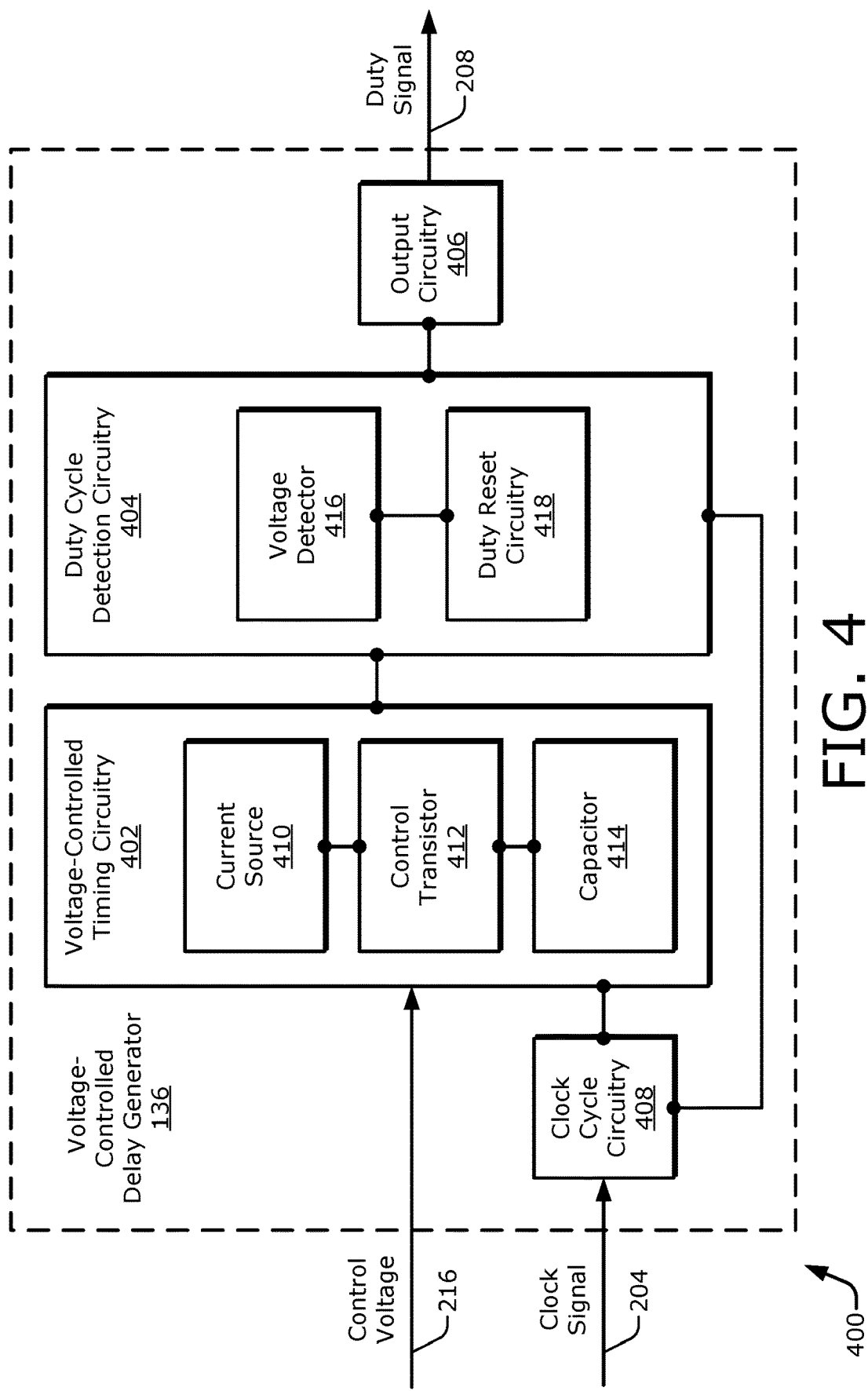
FIG. 4 illustrates an example voltage-controlled delay generator that includes voltage-controlled timing circuitry and duty cycle detection circuitry.

FIG. 4 is a schematic diagram 400 illustrating an example voltage-controlled delay generator 136. The voltage-controlled delay generator 136 can generate the duty signal 208 based on the clock signal 204 and the control voltage 216. As shown, the voltage-controlled delay generator 136 includes voltage-controlled timing circuitry 402, duty cycle detection circuitry 404, output circuitry 406, and clock cycle circuitry 408. The voltage-controlled timing circuitry 402 includes a current source 410, a control transistor 412, and a capacitor 414. The duty cycle detection circuitry 404 includes a voltage detector 416 and duty reset circuitry 418. However, the voltage-controlled delay generator 136 can include alternative, different, or more circuitry or circuit components than those that are illustrated.

In example implementations, the current source 410, the control transistor 412, and the capacitor 414 are coupled together in series. These components are arranged such that a current from the current source 410 can be routed through the control transistor 412 to the capacitor 414. At the capacitor 414, the current can accumulate as a charge amount to raise a charging voltage at the capacitor 414. The control transistor 412 is configured to pass or block the current based on the charging voltage and the control voltage 216, as is described below.

Thus, the current source 410 is configured to source a current at a determinable rate and provide this current to the capacitor, at least part of the time. The current source 410 can therefore be realized with a determinable current source that provides a determinable current. A determinable current source that provides a determinable current can be realized with, for instance, a constant current source that provides a constant current. Generally, a determinable current can have, for example, a magnitude that is constant or that is determinable based on some predetermined parameter, such as a signal. Thus, a current can vary in some predetermined manner, such as by being adaptive to another signal, to achieve one or more desired characteristics. In operation, by ascertaining the determinable current rate, the voltage-controlled delay generator 126 can be configured to have a linear transfer function. The current source 410 can be implemented using, for example, a current mirror formed from two transistors, with one of the two transistors configured as a diode-connected transistor. The capacitor 414 can be implemented using, for example, two metal plates, a transistor configured to function in a capacitive manner, and so forth. The control transistor 412, which gates a flow of the current with respect to reaching the capacitor 414, is described further with reference to FIGS. 5-9.

The clock cycle circuitry 408 is configured to operate the voltage-controlled delay generator 136 based on the clock signal 204, such as responsive to one or more edges 306-1 to 306-3 of the clock signal 204. The clock cycle circuitry 408 is in communication with the duty cycle detection circuitry 404 or the output circuitry 406 to cause the duty signal 208 to have beginning and ending edges 308 of each period 302 that align with the edges 306 of the clock signal 204, as shown in FIG. 3. The clock cycle circuitry 408 interacts with the duty reset circuitry 418 to cause a change to the duty signal 208 (e.g., to precipitate an appearance of an edge 308) that signifies an end of a current cycle and a beginning of a next cycle.

The output circuitry 406 is responsible for buffering or inverting a signal to produce a duty signal 208 with a desired high versus low voltage format. The output circuitry 406 is configured to respond to the voltage detector 416, which indicates when a delay duration 304 is to be terminated. The voltage detector 416 operates responsive to a voltage produced, at least partially, by the control transistor 412. These charges, voltages, signals, and corresponding functionality are described with reference to FIG. 6, after an example circuit structure is described with reference to FIG. 5.

Figure 5:
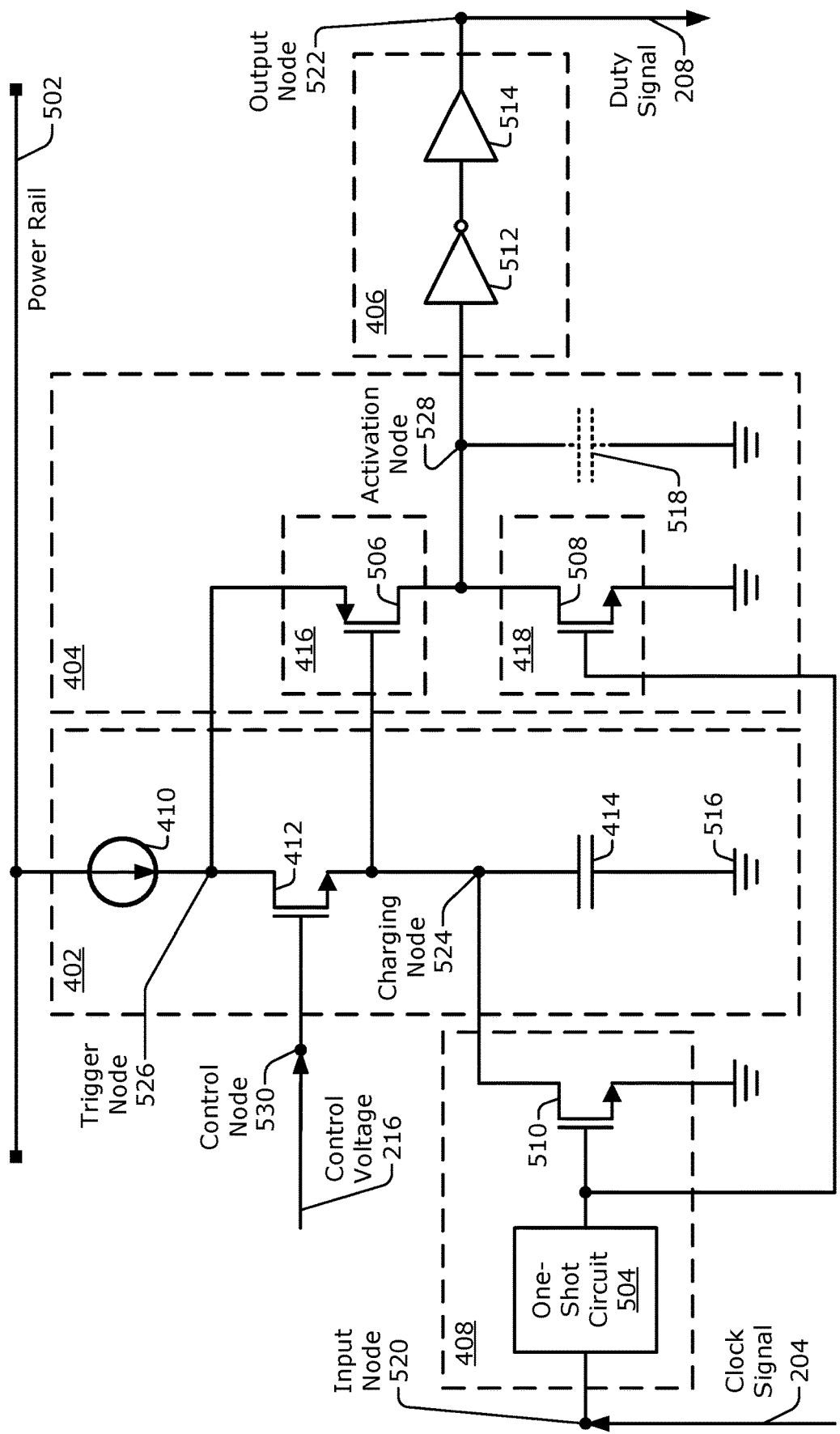
FIG. 5 illustrates an example implementation of a voltage-controlled delay generator in which the duty cycle detection circuitry lacks a current source.
Figure 7:
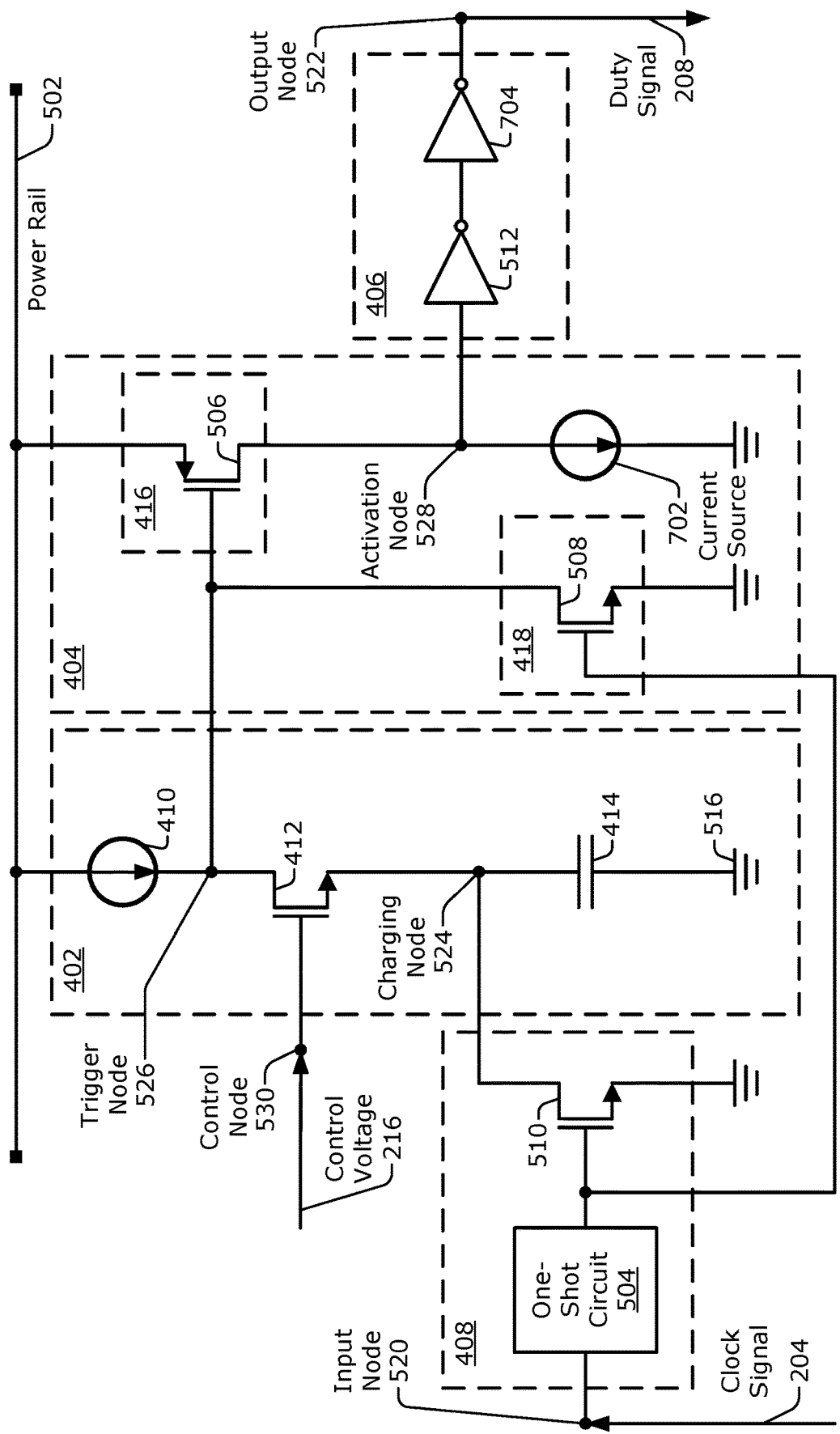
FIG. 7 illustrates an example implementation of a voltage-controlled delay generator in which the duty cycle detection circuitry includes a current source.
Figure 8:
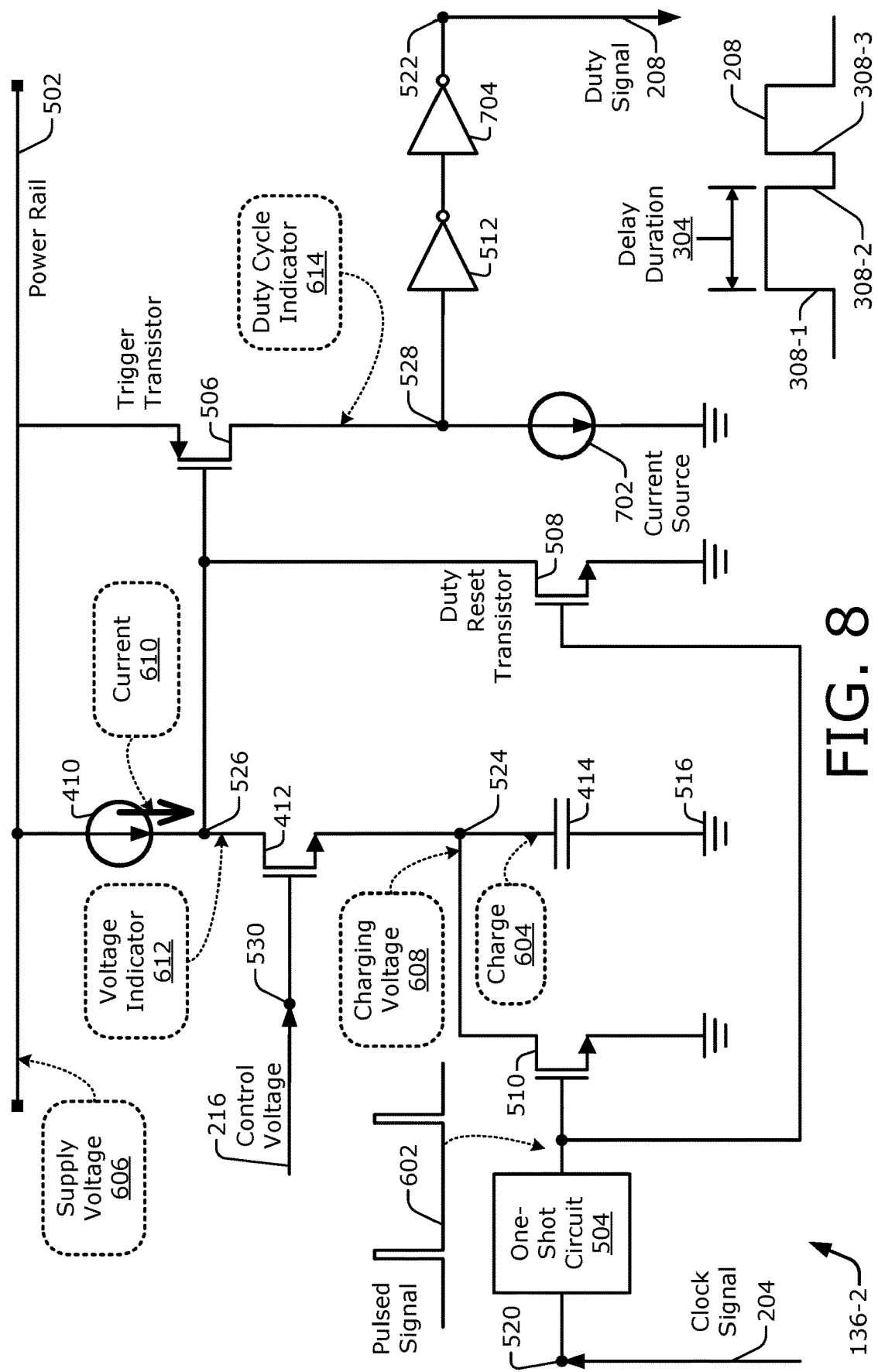
FIG. 8 illustrates another view of the example implementation of a voltage-controlled delay generator as shown in FIG. 7, including depictions of example operative circuit conditions.

FIG. 5 illustrates an example implementation of a voltage-controlled delay generator 136-1 in which the duty cycle detection circuitry 404 lacks a current source (as compared to the example of FIGS. 7 and 8). The illustration includes the voltage-controlled timing circuitry 402, the duty cycle detection circuitry 404, the output circuitry 406, and the clock cycle circuitry 408 from FIG. 4. FIG. 5 further includes the current source 410, the control transistor 412, the capacitor 414, the voltage detector 416, and the duty reset circuitry 418. FIG. 5 also depicts a power rail 502 and a ground node 516.

The voltage-controlled delay generator 136-1 includes an input node 520 that receives the clock signal 204, a control node 530 that receives the control voltage 216, and an output node 522 that provides the duty signal 208. The voltage-controlled timing circuitry 402 includes a charging node 524 and a trigger node 526. The duty cycle detection circuitry 404 includes an activation node 528.

The clock cycle circuitry 408 includes a one-shot circuit 504 and a clock reset transistor 510. The one-shot circuit 504 can be implemented using, for example, a monostable multivibrator. The one-shot circuit 504 and the clock reset transistor 510 are coupled between the input node 520 and the charging node 524 of the voltage-controlled timing circuitry 402. The clock cycle circuitry 408 is also coupled to the duty reset circuitry 418 of the duty cycle detection circuitry 404.

In the voltage-controlled timing circuitry 402, the current source 410, the control transistor 412, and the capacitor 414 are coupled together in series between the power rail 502 and the ground node 516. Specifically, the current source 410 is coupled between the power rail 502 and the trigger node 526. The control transistor 412 is coupled between the trigger node 526 and the charging node 524. And the capacitor 414 is coupled between the charging node 524 and the ground node 516. The voltage-controlled timing circuitry 402 is coupled to the duty cycle detection circuitry 404 via the charging node 524 and the trigger node 526.

In the duty cycle detection circuitry 404, the voltage detector 416 is implemented with a trigger transistor 506, and the duty reset circuitry 418 is implemented with a duty reset transistor 508. The trigger transistor 506 and the duty reset transistor 508 are coupled together in series between the trigger node 526 and the ground node 516. The activation node 528 is located between the trigger transistor 506 and the duty reset transistor 508. A capacitor 518 is depicted as being coupled between the activation node 528 and the ground node 516. The capacitor 518 is configured as a lowpass filter. The capacitor 518 can be implemented as an architected element or as parasitic capacitance. The duty cycle detection circuitry 404 is coupled to the output circuitry 406 via the activation node 528.

Thus, the output circuitry 406 is coupled between the activation node 528 and the output node 522. The output circuitry 406 is configured to buffer or invert an incoming signal before providing the duty signal 208 at the output node 522. As shown, the output circuitry 406 includes an inverter 512 and a buffer 514. An input of the inverter 512 is coupled to the activation node 528, and an output of the buffer 514 is coupled to the output node 522.

As illustrated, the control transistor 412, the clock reset transistor 510, and the duty reset transistor 508 are realized with a respective n-type FET (NFET). The trigger transistor 506, on the other hand, is realized with a p-type FET (PFET). Each of the FETs respectively includes a gate terminal, a source terminal, and a drain terminal. Although particular components and arrangements of such components are depicted in FIG. 5, the voltage-controlled delay generator 136-1 can include alternative, different, or more circuitry or circuit elements than those that are illustrated. Example operations of the voltage-controlled delay generator 136-1 are described with reference to FIG. 6.

Figure 6:
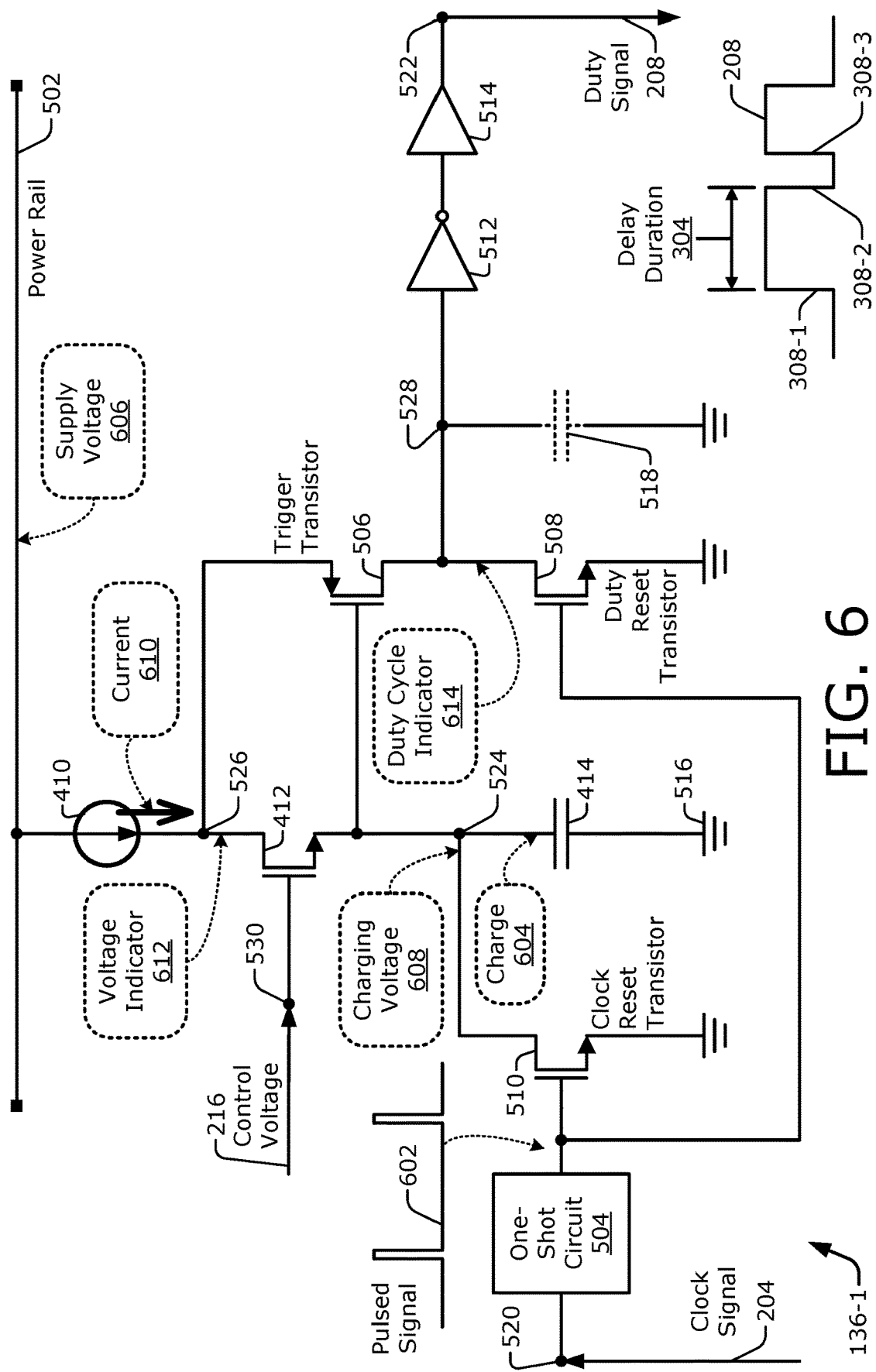
FIG. 6 illustrates another view of the example implementation of a voltage-controlled delay generator as shown in FIG. 5, including depictions of example operative circuit conditions.

FIG. 6 illustrates another view of the example implementation of a voltage-controlled delay generator 136-1 as shown in FIG. 5. This view includes indications of example operative circuit aspects, such as a pulsed signal 602 and a charge 604. The power rail 502 is held at a supply voltage 606 by a voltage regulator or PMIC (not shown). The control transistor 412 can be in one state of multiple potential states, such as being in an "on" state or an "off" state for a situation in which the transistor is biased to have an on/off state. As shown, the control transistor 412 is configured as a source follower. Here, the source follower comprises an n-type metal-oxide-semiconductor (NMOS) transistor. The control transistor 412 includes a gate terminal, a source terminal, and a drain terminal. The gate terminal corresponds to—e.g., coincides with or is coupled to—the control node 530 to receive the control voltage 216. The source terminal corresponds to the charging node 524, which is located between the control transistor 412 and the capacitor 414. The drain terminal corresponds to the trigger node 526 between the control transistor 412 and the current source 410.

In an example operation, the clock signal 204 is received at the input node 520. The one-shot circuit 504 converts the clock signal 204 having multiple edges 306 (of FIG. 3) into the pulsed signal 602. The pulsed signal 602 has repeated pulses that are relatively narrow as the state of the one-shot circuit 504 quickly returns to a stable state after being energized. Here, the one-shot circuit 504 is energized responsive to consecutive edges 306 of a same type, such as the rising edge 306-1 and the rising edge 306-3. Each time the one-shot circuit 504 is energized responsive to an arriving edge 306, the one-shot circuit 504 drives a pulse, such as a positive voltage pulse, as part of the pulsed signal 602.

A positive voltage pulse of the pulsed signal 602 is applied to a gate terminal of the clock reset transistor 510 and a gate terminal of the duty reset transistor 508. The positive voltage pulse turns on both NFETs. Consequently, the charge 604 at the charging node 524 is drained to the ground node 516 via the clock reset transistor 510. The charging node 524 therefore starts the cycle at a low voltage level. Similarly, the duty reset transistor 508 turns on responsive to the pulse of the pulsed signal 602 and changes the voltage at the activation node 528 to a reset value (e.g., a low voltage level for the voltage-controlled delay generator 136-1). This low voltage level is flipped by the inverter 512, and the duty signal 208 presents a rising edge 308-1 as shown in the lower right corner of FIG. 6.

Thus, there is a negligible or substantially zero charge 604 at the capacitor 414 at the beginning of a cycle. The charging voltage 608 at the charging node 524 is therefore low. Meanwhile, some positive voltage level is applied to the control node 530 via the control voltage 216. With the positive voltage at the gate of the control transistor 412 and negligible charge 604 at the capacitor 414, the control transistor 412 is in an on state. Because the control transistor 412 is on, the control transistor 412 permits current to flow through a source-drain channel thereof. The current source 410 provides a current 610 (e.g., a constant or other determinable current) at the trigger node 526. The current 610 is routed to the capacitor 414 at the charging node 524 via the control transistor 412. Due to the control transistor 412 passing the current 610 from the current source 410 to the charging node 524, the charge 604 begins to accumulate at the capacitor 414.

As the charge 604 accumulates at the capacitor 414, the charging voltage 608 starts to rise. The charging voltage 608 continues to rise as long as the current 610 reaches the charging node 524. However, the current is blocked from flowing to the capacitor 414 if the control transistor 412 is turned off. The control transistor 412 turns off once the charging voltage 608 plus a threshold voltage (Vth) of the control transistor 412 is equal to or greater than the control voltage 216. In this manner, the control transistor 412 is tracking changes to the charging voltage 608, which reflects the accumulated charge 604. The gate-to-source voltage (Vgs) is implicitly comparing the control voltage 216 to the charging voltage 608 because the control transistor 412 enters an off state once the charging voltage 608 reaches a certain voltage level relative to that of the control voltage 216. In these manners, the threshold voltage (Vth) and the associated ability to turn the control transistor 412 on and off based on the gate-to-source voltage (Vgs) thereof provide a comparison mechanism for implicitly comparing the control voltage 216 to the charging voltage 608 associated with the charge 604 accumulated at the capacitor 414.

After the control transistor 412 turns off, the current 610 can no longer flow through the control transistor 412 to the capacitor 414. Consequently, a voltage level at the trigger node 526 starts to increase. This voltage level is referred to herein as a voltage indicator 612 because once the voltage starts to increase, the voltage-controlled timing circuitry 402 is indicating that a certain amount of time has elapsed. Specifically, this is the amount of time for the current 610 to accumulate the charge 604 at the capacitor 414 and increase the charging voltage 608 at the charging node 524 to equal or exceed the control voltage 216 minus the threshold voltage of the control transistor 412. Once this happens, the control transistor 412 changes to an off state. The control transistor 412 therefore adjusts a voltage level of the voltage indicator 612 responsive to the changing of the on/off state of the control transistor 412. In these manners, the control transistor 412 provides a control mechanism for producing the voltage indicator 612 based on the control voltage 216 and the charge 604 accumulated at the capacitor 414.

Thus, the control transistor 412 produces the voltage indicator 612, which is now rising, at the trigger node 526. A timing of an occurrence of the voltage indicator 612 (e.g., a timing of a change to a voltage level at the trigger node 526) is responsive to the control voltage 216. The trigger transistor 506 is monitoring the voltage indicator 612 at the trigger node 526. A gate terminal of the trigger transistor 506 is coupled to the charging node 524 and is therefore at the charging voltage 608. As the current 610 adds charge to the trigger node 526, a voltage level of the voltage indicator 612 climbs above the charging voltage 608. Once this difference exceeds a threshold voltage (Vth) of the trigger transistor 506, the voltage indicator 612 triggers the trigger transistor 506 to turn on. The charge from the trigger node 526 and the current 610 from the current source 410 flow through the trigger transistor 506 to the activation node 528. With the gate terminal of the trigger transistor 506 coupled to the charging node 524 to sense the charging voltage 608 associated with the charge 604, this implementation of the trigger transistor 506 provides a trigger mechanism for activating the duty cycle indicator 614 based on the voltage indicator 612 and the charging voltage 608 associated with the charge 604 accumulated at the capacitor 414.

The arrival of the charge and the current 610 at the output circuitry 406 (of FIGS. 4 and 5) increases a voltage level at the activation node 528. In other words, the duty cycle indicator 614 increases because the duty reset transistor 508 is turned off and functioning substantially like an open circuit switch. As the voltage level of the duty cycle indicator 614 rises, the trigger transistor 506 can cause a termination of the delay duration 304 once this voltage level can activate the inverter 512 to flip the output thereof. In these manners, the trigger transistor 506 generally provides a detection mechanism for providing a duty cycle indicator 614 based on the voltage indicator 612. For example, if the voltage level of the duty cycle indicator 614 exceeds a threshold voltage for an input transistor (not shown) of the inverter 512, the inverter 512 inverts the positive voltage level at the activation node 528 and flips a prior voltage level at an output of the inverter 512.

Thus, the inverter 512 forwards a low voltage level to the buffer 514 responsive to the duty cycle indicator 614 becoming a high voltage level. This low voltage level corresponds to the falling edge 308-2 of the duty signal 208 and causes a termination of the delay duration 304. The low voltage level of the duty signal 208 continues until the end of the current cycle. The end of the current cycle is represented by the rising edge 308-3. This rising edge 308-3 occurs when the one-shot circuit 504 provides the next pulse of the pulsed signal 602 to the duty reset transistor 508. The pulse causes the duty reset transistor 508 to function like a closed switch and drains the charge at the activation node 528 and begins the next cycle.

A length of the delay duration 304 can be adjusted based on a level of the control voltage 216. The higher the control voltage 216 is, the higher the charging voltage 608 has to climb before turning off the control transistor 412. The higher the charging voltage 608 has to climb, the more charge 604 has to accumulate at the capacitor 604. The more charge 604 that has to accumulate at the capacitor 414, the longer the current 610 has to flow to provide that amount of charge 604. Thus, as the control voltage 216 is raised, the length of the delay duration 304 increases. Conversely, as the control voltage 216 is lowered, the length of the delay duration 304 decreases.

FIG. 7 illustrates an alternative example implementation of a voltage-controlled delay generator 136-2 in which the duty cycle detection circuitry 404 includes a current source 702. The voltage-controlled timing circuitry 402 and the clock cycle circuitry 408 of the voltage-controlled delay generator 136-2 of FIGS. 7 and 8 can be implemented the same as for the voltage-controlled delay generator 136-1 of FIGS. 5 and 6. However, the duty cycle detection circuitry 404 differs between the two. The interconnections are different, and the current source 702 is included in FIG. 7. Further, the output circuitry 406 includes another inverter—an inverter 704.

The trigger transistor 506 of the voltage detector 416 has a gate terminal that is coupled to the trigger node 526. A drain terminal of the duty reset transistor 508 is also coupled to the trigger node 526, and thus to the gate terminal of the trigger transistor 506. This enables the duty reset transistor 508 to impact the functionality of the trigger transistor 506. For example, the duty reset transistor 508 can, in some circumstances, cause the trigger transistor 506 to change states between off and on. The trigger transistor 506 has a source terminal coupled to the power rail 502 and a drain terminal coupled to the activation node 528. The current source 702 is coupled between the activation node 528 and the ground node 516. The output circuitry 406 couples the inverter 512 in series with the inverter 704 between the activation node 528 and the output node 522. An input of the inverter 512 is coupled to the activation node 528, and an output of the inverter 704 is coupled to the output node 522.

FIG. 8 illustrates another view of the example implementation of a voltage-controlled delay generator 136-2 as shown in FIG. 7, including indications of example operative circuit aspects. The one-shot circuit 504 creates a first pulse and a second pulse of the pulsed signal 602. Responsive to application of the first pulse of the pulse signal 602 to a gate terminal of the duty reset transistor 508, the duty reset transistor 508 is turned on. With the duty reset transistor 508 being on, a voltage level at the trigger node 526 is brought to a ground potential of the ground node 516. Thus, the voltage indicator 612 has a low voltage level, which turns on the trigger transistor 506.

With the trigger transistor 506 being on, the current source 702 pulls a current through the trigger transistor 506 to establish a reset value at the activation node 528. For the voltage-controlled delay generator 136-2, a voltage level of the duty cycle indicator 614 has a high value at the activation node 528 to start a new cycle. This activates a new period for the duty signal 208 at the edge 308-1 due to the double inversion of the voltage level across the inverters 512 and 704. Thus, the delay duration 304 is transpiring, and the duty signal 208 has a high voltage level as shown in the lower right corner of FIG. 8. Meanwhile, the first pulse of the pulsed signal 602 has started the charging of the capacitor 414 at the charging node 524. The current source 410, the control transistor 412, and the capacitor 414 operate in the voltage-controlled delay generator 136-2 similarly or analogously to how each operates in the voltage-controlled delay generator 136-1 of FIGS. 5 and 6. Thus, the control transistor 412 eventually changes state to be turned off based on a level of the control voltage 216 and the charging voltage 608, and the voltage level of the voltage indicator 612 begins to rise.

Once the voltage indicator 612 at the gate terminal of the trigger transistor 506 reaches a sufficiently high voltage level relative to the supply voltage 606 at the source terminal thereof, the trigger transistor 506 changes state by turning off. Responsive to the trigger transistor 506 being turned off, the voltage level of the duty cycle indicator 614 decreases at an input of the inverter 512 until the inverter 512 flips a value at the output thereof. This activates the inverters 512 and 704 of the output circuitry 406 to terminate the delay duration 304 by generating the edge 308-2. With the gate terminal of the trigger transistor 506 coupled to the trigger node 526 to sense the voltage indicator 612 and the source terminal of the trigger transistor 506 coupled to the power rail 502, this implementation of the trigger transistor 506 provides a trigger mechanism for activating the duty cycle indicator 614 based on the voltage indicator 612 and the supply voltage 606 provided by the power rail 502.

In these manners, the voltage-controlled delay generator 136-2 generates the duty signal 208 to have a delay duration 304 with a length that is dependent on the control voltage 216. The functionality of the voltage-controlled delay generator 136-2 from a signaling and voltage perspective is comparable to that of the voltage-controlled delay generator 136-1 of FIGS. 5 and 6. However, the inclusion of the current source 702 in the duty cycle detection circuitry 404 causes an increased current draw, which results in relatively more power being used.

Figure 9:
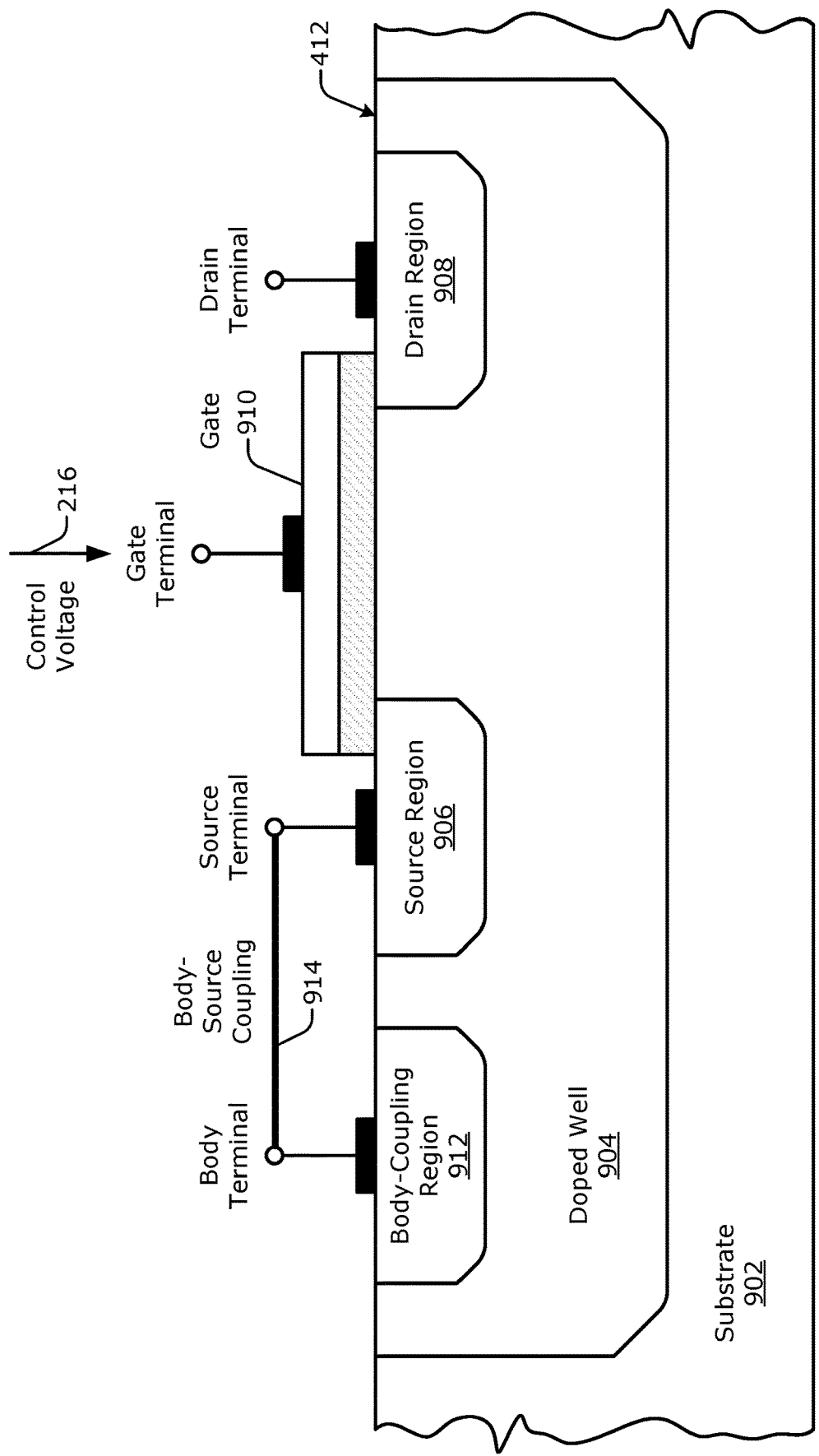
FIG. 9 illustrates a cross-section view of an example semiconductor construct for realizing at least one transistor of a voltage-controlled delay generator as described herein.

FIG. 9 illustrates a cross-section view of an example semiconductor construct 900 for realizing at least one transistor of a voltage-controlled delay generator as described herein. In the example implementations described above with reference to FIGS. 5-8 for the voltage-controlled delay generator 136, the control transistor 412 is realized using an NMOS transistor that is configured as a source follower (e.g., with an n-type field effect transistor (NFET)). Other illustrated transistors, such as the clock reset transistor 510 and the duty reset transistor 508, can also be implemented with NFETs. In some aspects, the various NFETs can be built together on the same substrate and disposed within a same doped well. However, in other aspects, the control transistor 412 is constructed alone within a doped well that is exclusive of other transistors. Providing the control transistor 412 a doped well exclusive of other transistors can increase a linear response of the control transistor 412 and therefore of the voltage-controlled delay generator 136.

An example implementation in which a control transistor 412 is solely disposed in a doped well 904 is depicted in FIG. 9. The semiconductor construct 900 includes a substrate 902, and the substrate 902 includes a doped well 904. The doped well 904 includes multiple doped regions: these regions are a source region 906, a drain region 908, and a body-coupling region 912. The source region 906 is coupled to a source terminal, the drain region 908 is coupled to a drain terminal, and the body-coupling region 912 is coupled to a body terminal. The control transistor 412 also includes a gate 910, which is coupled to a gate terminal to receive the control voltage 216.

To further increase linearity, the body terminal can be coupled to the source terminal, such as via a body-source coupling 914, as shown. In an example NFET implementation of the control transistor 412, the substrate 902 comprises an n-substrate, and the doped well 904 comprises a positively-doped well (p-well). Further, the source region 906 comprises an n+ region, the drain region 908 comprises an n+ region, and the body-coupling region 912 comprises a p+ region. Alternatively, a PFET transistor in a solo doped well can be implemented with complementary doping.

Figure 10:
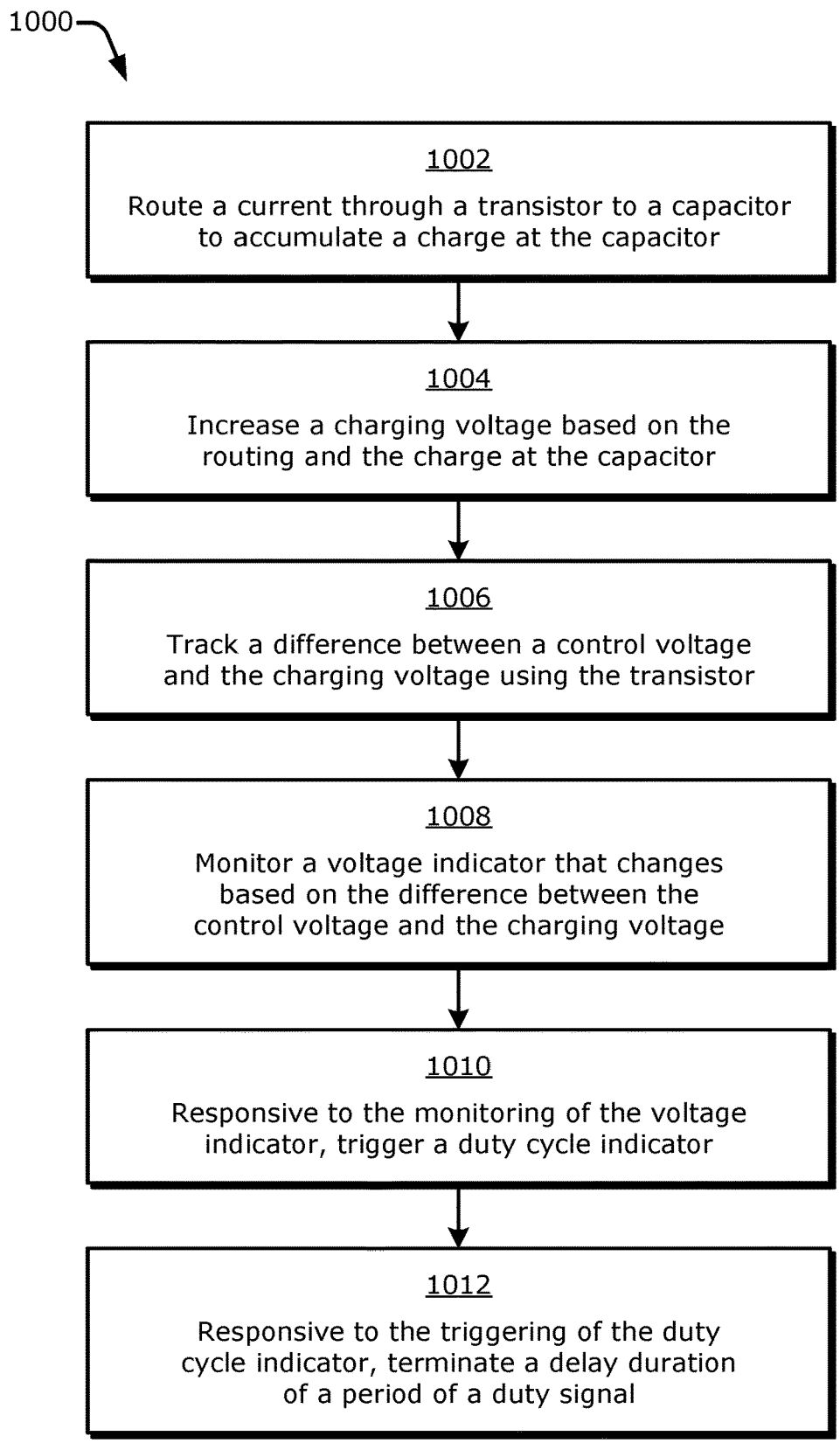
FIG. 10 is a flow diagram illustrating an example process for operating a voltage-controlled delay generator as described herein.

FIG. 10 is a flow diagram illustrating an example process 1000 for operating a voltage-controlled delay generator as described herein. The process 1000 is described in the form of a set of blocks 1002-1012 that specify operations that can be performed. However, operations are not necessarily limited to the order shown in FIG. 10 or described herein, for the operations may be implemented in alternative orders or in fully or partially overlapping manners. Operations represented by the illustrated blocks of the process 1000 may be performed by a voltage-controlled delay generator 136 (e.g., of FIG. 1, 2, or 4-8). More specifically, the operations of the process 1000 may be performed by voltage-controlled timing circuitry 402, duty cycle detection circuitry 404, and output circuitry 406, as well as the components thereof.

At block 1002, a current is routed through a transistor to a capacitor to accumulate a charge at the capacitor. For example, the voltage-controlled timing circuitry 402 can route a current 610 through a control transistor 412 to a capacitor 414 to accumulate a charge 604 at the capacitor

414. By using a current source 410 that provides the current 610 (e.g., a determinable current source that provides a current with a determinable magnitude), the charge 604 increases at a determinable rate, which enables the voltage-controlled delay generator 136 to be operated with a linear transfer function. For instance, a determinable current source can provide a determinable current having a magnitude that is constant or responsive to a signal.

At block 1004, a charging voltage is increased based on the routing and the charge at the capacitor. For example, as the control transistor 412 permits the current 610 to flow to the charge 604 at the capacitor 414, a charging voltage 608 can increase as a result. The control transistor 412 may control whether or not the current 610 is blocked or is permitted to flow to a charging node 524 associated with the charging voltage 608.

At block 1006, a difference between a control voltage and the charging voltage is tracked using the transistor. For example, the control transistor 412 can track a difference between a control voltage 216 and the charging voltage 608. To do so, the control transistor 412 may track a level of the charging voltage 608 relative to a level of the control voltage 216 at different terminals thereof based on a threshold voltage (Vth) of the control transistor 412 which results in the control transistor 412 being in an on state or an off state. The control transistor 412 may therefore implicitly compare the charging voltage 608 with the control voltage 216 using a gate-source voltage differential (Vgs) associated with the threshold voltage (Vth) of the control transistor 412.

At block 1008, a voltage indicator that changes based on the difference between the control voltage and the charging voltage is monitored. For example, a voltage detector 416 can monitor a voltage indicator 612 that changes based on the difference between the control voltage 216 and the charging voltage 608. For instance, a terminal of a trigger transistor 506 may be coupled to a terminal of the control transistor 412 that exhibits the voltage indicator 612 responsive to whether the control transistor 412 is in an on state or an off state.

At block 1010, responsive to the monitoring of the voltage indicator, a duty cycle indicator is triggered. For example, the voltage detector 416 can trigger a change to a duty cycle indicator 614 responsive to the monitoring of the voltage indicator 612. The trigger transistor 506 may change states, such as between on and off states, to cause a voltage level of the duty cycle indicator 614 to change at an activation node 528. This voltage level change at the activation node 528 activates output circuitry 406.

At block 1012, responsive to the triggering of the duty cycle indicator, a delay duration of a period of a duty signal is terminated. For example, the output circuitry 406 can terminate a delay duration 304 of a period 302 of a duty signal 208 responsive to the triggering of the duty cycle indicator 614. To do so, at least one inverter 512 or buffer 514 may propagate the changed voltage level from the activation node 528 to an output node 522. This causes an edge (e.g., a rising edge 308-2) to be exhibited in the duty signal 208.

Figure 11:
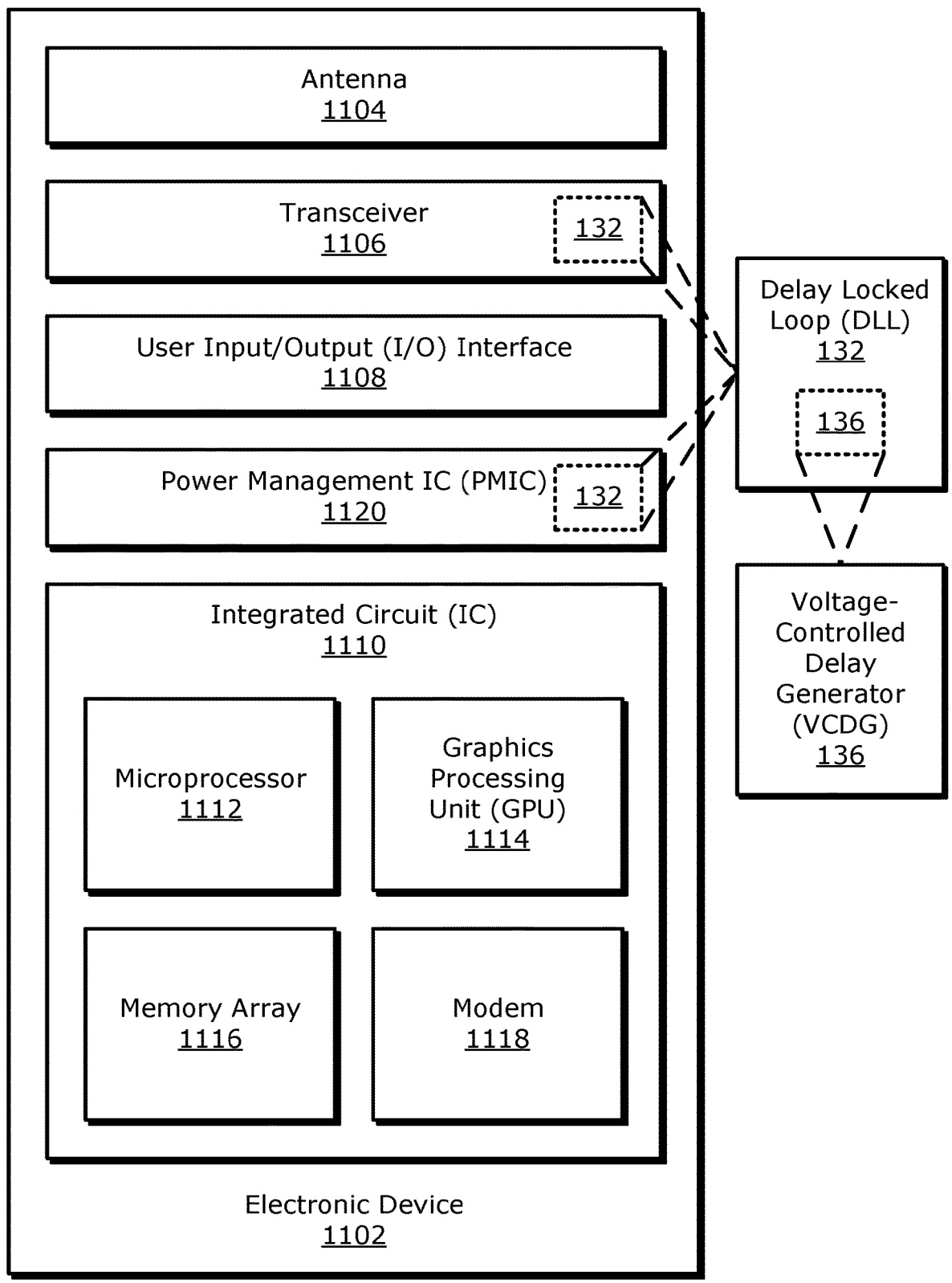
FIG. 11 illustrates an example electronic device in which a voltage-controlled delay generator as described herein can be implemented.

FIG. 11 illustrates an example electronic device 1102 in which a voltage-controlled delay generator 136 can be implemented. As shown, the electronic device 1102 includes an antenna 1104, a transceiver 1106, a user input/output (I/O) interface 1108, a power management IC 1120 (PMIC), and an integrated circuit 1110. Illustrated examples of the integrated circuit 1110, or cores thereof, include a microprocessor 1112, a graphics processing unit (GPU) 1114, a memory array 1116, and a modem 1118. In one or more example implementations, a delay locked loop 132 including a voltage-controlled delay generator 136 as described herein can be implemented by the transceiver 1106, by the power management IC 1120, by the integrated circuit 1110 (not explicitly shown), and so forth.

The electronic device 1102 can be a mobile or battery-powered device or a fixed device that is designed to be powered by an electrical grid. Examples of the electronic device 1102 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1102 can also be a device, or a portion thereof, having embedded electronics. Examples of the electronic device 1102 with embedded electronics include a passenger vehicle, industrial equipment, a refrigerator or other home appliance, a drone or other unmanned aerial vehicle (UAV), or a power tool.

For an electronic device with a wireless capability, the electronic device 1102 includes an antenna 1104 that is coupled to a transceiver 1106 to enable reception or transmission of one or more wireless signals. The integrated circuit 1110 may be coupled to the transceiver 1106 to enable the integrated circuit 1110 to have access to received wireless signals or to provide wireless signals for transmission via the antenna 1104. The electronic device 1102 as shown also includes at least one user I/O interface 1108. Examples of the user I/O interface 1108 include a keyboard, a mouse, a microphone, a touch-sensitive screen, a camera, an accelerometer, a haptic mechanism, a speaker, a display screen, or a projector. The transceiver 1106 can correspond to, for example, the wireless transceiver 120 (e.g., of FIG. 1) that implements a delay locked loop 132 including a voltage-controlled delay generator 136 as described herein. The power management IC 1120 can include, for example, a voltage regulator that employs a delay locked loop 132 including a voltage-controlled delay generator 136 as described herein.

The integrated circuit 1110 may comprise, for example, one or more instances of a microprocessor 1112, a GPU 1114, a memory array 1116, a modem 1118, and so forth. The microprocessor 1112 may function as a central processing unit (CPU) or other general-purpose processor. Some microprocessors include different parts, such as multiple processing cores, that may be individually powered on or off. The GPU 1114 may be especially adapted to process visual-related data for display, such as video data images. If visual-related data is not being rendered or otherwise processed, the GPU 1114 may be fully or partially powered down. The memory array 1116 stores data for the microprocessor 1112 or the GPU 1114. Example types of memory for the memory array 1116 include random access memory (RAM), such as dynamic RAM (DRAM) or static RAM (SRAM); flash memory; and so forth. If programs are not accessing data stored in memory, the memory array 1116 may be powered down overall or block-by-block. The modem 1118 demodulates a signal to extract encoded information or modulates a signal to encode information into the signal. If there is no information to decode from an inbound communication or to encode for an outbound communication, the modem 1118 may be idled to reduce power consumption. The integrated circuit 1110 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1110 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1110 generally, may be termed cores or circuit blocks. Examples of cores or circuit blocks include, in addition to those that are illustrated in FIG. 11, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks. Although not explicitly shown in FIG. 11, a core or other aspect of the integrated circuit 1110 may implement a delay locked loop 132 or other circuitry (e.g., a duty locked loop or a clock tree) that employs a voltage-controlled delay generator 136 as described herein.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
voltage-controlled timing circuitry configured to receive a control voltage, the voltage-controlled timing circuitry including a current source, a control transistor, and a capacitor that are configured to produce a voltage indicator based on the control voltage;
duty cycle detection circuitry coupled to the voltage-controlled timing circuitry comprising a second transistor connected in parallel with the control transistor and configured to conduct current provided by the current source from a source of the second transistor to a drain of the second transistor, the duty cycle detection circuitry configured to detect the voltage indicator and provide a duty cycle indicator based on the voltage indicator and based on the current conducted by the second transistor; and
output circuitry coupled to the duty cycle detection circuitry, the output circuitry configured to generate a duty signal based on the duty cycle indicator.

2. The apparatus of claim 1, wherein:
the duty cycle indicator is indicative of a delay duration; and
the duty signal has a duty cycle that is based on the delay duration.

3. The apparatus of claim 2, wherein the voltage-controlled timing circuitry is configured to change the delay duration by changing a timing of an occurrence of the voltage indicator responsive to a change to the control voltage.

4. The apparatus of claim 2, further comprising:
clock cycle circuitry coupled to the voltage-controlled timing circuitry, the clock cycle circuitry configured to:
receive a clock signal and generate a pulsed signal based on the clock signal; and
reset the capacitor responsive to the pulsed signal; and
the duty signal has a period that is based on a period of the clock signal.

5. The apparatus of claim 4, wherein the clock cycle circuitry comprises a one-shot circuit that is configured to generate the pulsed signal responsive to a series of edges of the clock signal.

6. The apparatus of claim 1, wherein the current source, the control transistor, and the capacitor are coupled together in series with each other.

7. The apparatus of claim 6, further comprising:
a power rail; and
a ground node, wherein:
the current source, the control transistor, and the capacitor are coupled together in series between the power rail and the ground node;
the current source is coupled to the power rail;
the capacitor is coupled to the ground node; and
the control transistor is coupled between the current source and the capacitor.

8. The apparatus of claim 6, wherein:
the current source comprises a constant current source;
the constant current source is configured to provide a constant current; and
the constant current source, the control transistor, and the capacitor are configured such that the constant current flows from the constant current source, through the control transistor, and to the capacitor.

9. The apparatus of claim 6, wherein the control transistor comprises an n-type field effect transistor (NFET).

10. The apparatus of claim 6, wherein:
the control transistor includes a gate terminal, a source terminal, and a drain terminal;
the control transistor is associated with a threshold voltage between the gate terminal and the source terminal; and
the current source, the control transistor, and the capacitor are configured to produce the voltage indicator based on the control voltage using the threshold voltage.

11. The apparatus of claim 10, wherein the voltage-controlled timing circuitry is configured to receive the control voltage via the gate terminal of the control transistor.

12. The apparatus of claim 10, wherein the current source, the control transistor, and the capacitor are configured to:
provide a current from the current source to the capacitor via the control transistor;
create a charging voltage with the capacitor using the current from the current source; and
produce the voltage indicator using an implicit comparison of the control voltage to the charging voltage using the threshold voltage associated with the control transistor.

13. The apparatus of claim 10, wherein:
the voltage-controlled timing circuitry is configured to provide the voltage indicator via the drain terminal of the control transistor; and the duty cycle detection circuitry includes a voltage detector that is coupled to the drain terminal of the control transistor and is configured to detect the voltage indicator via the drain terminal.

14. The apparatus of claim 13, wherein:
the voltage detector comprises a trigger transistor; and
the trigger transistor is configured to switch between an on state and an off state responsive to the voltage indicator to produce the duty cycle indicator.

15. The apparatus of claim 1, further comprising:
a doped well,
wherein the control transistor is disposed within the doped well exclusive of other transistors.

16. The apparatus of claim 15, wherein:
the control transistor comprises an n-type metal-oxide-semiconductor (NMOS) transistor; and
the NMOS transistor is configured in the voltage-controlled timing circuitry as a source follower.

17. The apparatus of claim 15, further comprising:
a body terminal associated with the control transistor, wherein:
the control transistor includes a gate terminal, a source terminal, and a drain terminal;
the doped well comprises a positively-doped well (p-well); and
the body terminal is coupled to the source terminal.

18. A method for operating a voltage-controlled delay generator, the method comprising:
routing a first current provided by a current source through a first transistor to a capacitor to accumulate a charge at the capacitor;
increasing a charging voltage based on the routing and the charge at the capacitor;
tracking a difference between a control voltage and the charging voltage using the first transistor;
monitoring a voltage indicator that changes based on the difference between the control voltage and the charging voltage;
responsive to the monitoring of the voltage indicator, triggering a duty cycle indicator to conduct a second current provided by the current source from a source of a second transistor to a drain of the second transistor, the second transistor being connected in parallel with the first transistor; and
responsive to the triggering of the duty cycle indicator, terminating a delay duration of a period of a duty signal.

19. The method of claim 18, further comprising:
receiving a clock signal;
generating a pulsed signal based on the clock signal, the pulsed signal including a first pulse and a second pulse;
beginning a period of the duty signal based on the first pulse;
prior to the increasing of the charging voltage, draining the charge at the capacitor responsive to the first pulse; and
after the terminating of the delay duration, ending the period of the duty signal based on the second pulse.

20. The method of claim 18, further comprising:
changing an on/off state of the first transistor responsive to the tracking; and
adjusting a voltage level of the voltage indicator responsive to the changing of the on/off state of the transistor.

21. The method of claim 18, wherein the tracking comprises tracking the difference between the control voltage and the charging voltage via a gate terminal and a source terminal, respectively, of the first transistor.

22. The method of claim 21, wherein the tracking comprises implicitly comparing the control voltage and the charging voltage using a threshold voltage of the first transistor.

23. An apparatus comprising:
a current source configured to provide a current;
a control transistor coupled to the current source, the control transistor configured to:
receive a control voltage;
receive the current from the current source and selectively pass or block the current; and
produce a voltage indicator based on the control voltage and a charging voltage;
a capacitor coupled to the control transistor and configured to accumulate a charge responsive to the control transistor passing the current from the current source, the charging voltage configured to change responsive to an accumulation of the charge;
a second transistor coupled in parallel with the control transistor and configured to conduct current provided by the current source from a source of the second transistor to a drain of the second transistor and activate a duty cycle indicator based on the current conducted by the second transistor; and
output circuitry coupled to the second transistor, the output circuitry configured to generate a duty signal based on the duty cycle indicator and a clock signal, the duty signal including a delay duration having a length that is based on the control voltage.

24. The apparatus of claim 23, further comprising:
a duty reset transistor coupled to the second transistor and the output circuitry, the duty reset transistor configured to reset the duty cycle indicator to a reset value responsive to the clock signal, wherein:
the second transistor is configured to activate the duty cycle indicator by changing the duty cycle indicator from the reset value based on the voltage indicator; and
the output circuitry includes an inverter having an input, the output circuitry configured to receive the duty cycle indicator via the input of the inverter and generate the duty signal using the inverter.

25. The apparatus of claim 1, further comprising a duty reset transistor having a drain connected the drain of the second transistor and wherein the gate of the second transistor is connected to a drain of the control transistor.

26. The apparatus of claim 1, further comprising a trigger transistor having a gate connected to the drain of the second transistor.

* * * * *